(12) United States Patent
Ha et al.

(10) Patent No.: US 9,620,389 B2
(45) Date of Patent: Apr. 11, 2017

(54) METHODS OF FABRICATING TAPE FILM PACKAGES

(71) Applicant: Samsung Electronics Co., Ltd., Suwon-si, Gyeonggi-do (KR)

(72) Inventors: Jeong-Kyu Ha, Hwaseong-si (KR); Youngshin Kwon, Osan-si (KR); KwanJai Lee, Yongin-si (KR); Jae-Min Jung, Seoul (KR); KyongSoon Cho, Goyang-si (KR); Sang-Uk Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/967,490

(22) Filed: Dec. 14, 2015

(65) Prior Publication Data

US 2016/0111299 A1    Apr. 21, 2016

Related U.S. Application Data

(62) Division of application No. 13/747,832, filed on Jan. 23, 2013, now Pat. No. 9,241,407.

(30) Foreign Application Priority Data

Jan. 25, 2012  (KR) .................. 10-2012-0007303

(51) Int. Cl.
*H01L 23/14*   (2006.01)
*H01L 23/498*  (2006.01)
(Continued)

(52) U.S. Cl.
CPC ........ *H01L 21/486* (2013.01); *H01L 21/4853* (2013.01); *H01L 21/563* (2013.01); *H01L 21/78* (2013.01); *H01L 23/145* (2013.01); *H01L 23/4985* (2013.01); *H01L 23/49524* (2013.01); *H01L 23/49827* (2013.01); *H01L 24/50* (2013.01); *H05K 1/114* (2013.01);
(Continued)

(58) Field of Classification Search
CPC ................. H01L 23/145; H01L 23/481; H01L 23/49524; H01L 23/49827; H01L 23/4985; H01L 23/49572; H01L 23/5384; H01L 23/5387; H01L 24/50; H01L 21/486; H05K 1/114; H05K 1/115; H05K 1/189

See application file for complete search history.

(56) References Cited

U.S. PATENT DOCUMENTS 5,334,857 A   8/1994  Mennitt et al.
6,171,714 B1  1/2001  Bergkessel et al.
(Continued)

FOREIGN PATENT DOCUMENTS

JP    07-005227      1/1995
KR    10-1998-0015389  5/1998
(Continued)

*Primary Examiner* — Robert Bachner
*Assistant Examiner* — Molly Reida
(74) *Attorney, Agent, or Firm* — Ward and Smith, P.A.

(57) ABSTRACT

A tape film package is provided including an insulating pattern; a via contact in a via hole in the insulating pattern; first interconnection patterns extending from the via contact to a cutting surface of the insulating pattern; and second interconnection patterns connected to the via contact below the insulating pattern. The second interconnection patterns are parallel to the first interconnection patterns and spaced apart from the cutting surface of the insulating pattern.

10 Claims, 14 Drawing Sheets

(51) Int. Cl.
    *H01L 21/48*     (2006.01)
    *H05K 1/11*     (2006.01)
    *H05K 3/10*     (2006.01)
    *H01L 23/00*     (2006.01)
    *H01L 23/495*     (2006.01)
    *H05K 3/00*     (2006.01)
    *H01L 21/56*     (2006.01)
    *H01L 21/78*     (2006.01)
    *H05K 1/18*     (2006.01)
    *H05K 3/42*     (2006.01)

(52) U.S. Cl.
    CPC ........... *H05K 1/115* (2013.01); *H05K 3/0052* (2013.01); *H05K 3/107* (2013.01); *H01L 2924/12042* (2013.01); *H05K 1/189* (2013.01); *H05K 3/42* (2013.01); *H05K 2203/1545* (2013.01); *Y10T 156/1052* (2015.01)

(56) References Cited

U.S. PATENT DOCUMENTS

| | | |
|---|---|---|
| 6,300,577 B1 | 10/2001 | Tsujii |
| 7,217,990 B2 | 5/2007 | Chung |
| 7,414,323 B2 | 8/2008 | Hirae |
| 2004/0155322 A1 | 8/2004 | Cho et al. |
| 2004/0219341 A1 | 11/2004 | Kataoka et al. |
| 2004/0245628 A1 | 12/2004 | Chung |
| 2006/0097286 A1 | 5/2006 | Chung et al. |
| 2007/0235888 A1 | 10/2007 | Her |
| 2008/0081161 A1 | 4/2008 | Tomita et al. |

FOREIGN PATENT DOCUMENTS

| | | |
|---|---|---|
| KR | 10-2004-0024695 A | 3/2004 |
| KR | 10-2004-0100526 A | 12/2004 |
| KR | 10-2011-0044532 A | 4/2011 |

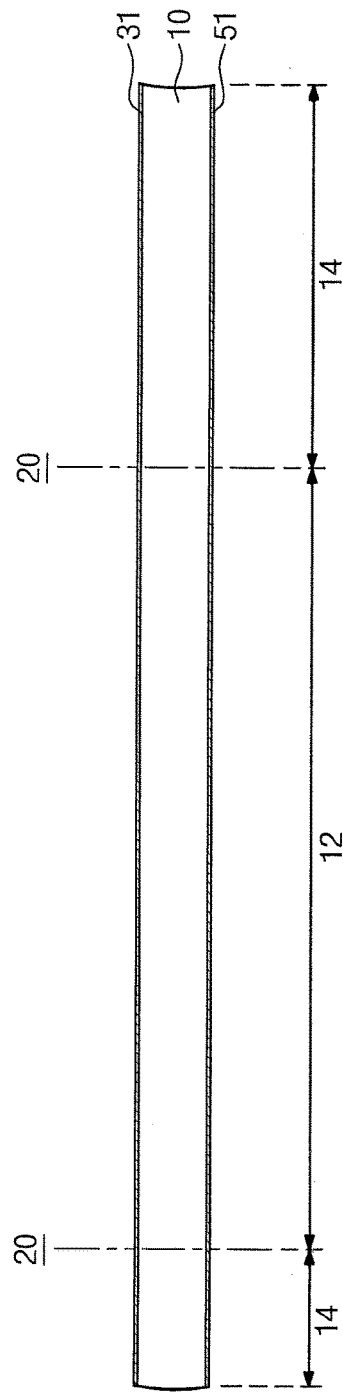
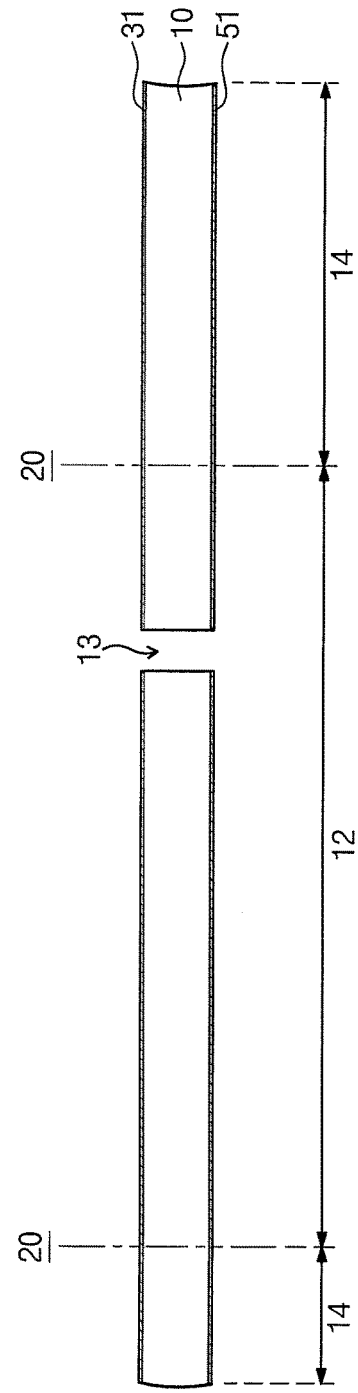

METHODS OF FABRICATING TAPE FILM PACKAGES

CROSS-REFERENCE TO RELATED APPLICATION

This application is a divisional of U.S. patent application Ser. No. 13/747,832, filed Jan. 23, 2013, which claims priority to Korean Patent Application No. 10-2012-0007303, filed Jan. 25, 2012, the entire contents of which are hereby incorporated herein by reference as if set forth in their entirety.

FIELD

The present inventive concept relates generally to a display device and, more particularly, to tape film packages connecting a panel of a display device and a printed circuit board (PCB) and related methods.

BACKGROUND

To meet technical demands for small-sized, thin, and lightweight electronic products, a tape film package technology has been proposed, which is a method of packaging high-density semiconductor chips. For example, the tape film package technology may include a tape carrier package technology or a chip-on-film (COF) package technology. For the COF package technology, a semiconductor die may be directly bonded onto a substrate in a flip chip bonding manner and be electrically connected to an external circuit via a relatively short lead. In other words, the COF package is a high density package technology, in which a dense formation of interconnection patterns can be realized.

The COF package technology may typically be used to connect a LCD panel serving as a display device for a portable unit or a laptop electrically with a printed circuit board (PCB). The LCD panel may be operated by a semiconductor chip with many input/output terminals and become thinner and thinner. As the result, the COF package technology capable of realizing the high density packaging is becoming increasingly widely used.

SUMMARY

Some embodiments of the inventive concept provide tape film packages configured to reduce the likelihood of an electric short caused by metal particles from occurring during a cutting process and related methods of fabrication.

Further embodiments of the inventive concept provide methods of fabrication that increase production yield and related tape film packages.

In some embodiments of the inventive concept, a tape film package may include an insulating pattern; a via contact in a via hole in the insulating pattern; first interconnection patterns extending from the via contact to a cutting surface of the insulating pattern; and second interconnection patterns connected to the via contact below the insulating pattern. The second interconnection patters are parallel to the first interconnection patterns and spaced apart from the cutting surface of the insulating pattern.

In further embodiments, the second interconnection patterns may be shorter than the first interconnection patterns.

In still further embodiments, the package may further include a solder resist covering a portion of the second interconnection patterns.

In some embodiments, the solder resist may be disposed below the insulating pattern between the second interconnection patterns and the cutting surface.

In further embodiments, the second interconnection patterns may include a second pad exposed by the solder resist.

In still further embodiments, the package may further include a solder resist covering the first interconnection patterns.

In some embodiments, the solder resist may cover the first interconnection pattern at the cutting surface.

In further embodiments, the first interconnection patterns may include first pads exposed by the solder resist and disposed at the cutting surface.

In still further embodiments, the second interconnection pattern may include a second seed pattern and a second upper interconnection pattern.

According to some embodiments of the inventive concept, a method of fabricating a tape film package may include providing an insulating pattern with a user region and a test region defined by a cutting line; forming a via hole in the insulating pattern of the user region; forming a via contact in the via hole; forming a first interconnection pattern connected to the via contact to extend from the user region to the test region; and forming a second interconnection pattern connected to the via contact below the insulating pattern, the second interconnection pattern being shorter than the first interconnection pattern in the user region and being spaced apart from the cutting line.

BRIEF DESCRIPTION OF THE DRAWINGS

Example embodiments will be more clearly understood from the following brief description taken in conjunction with the accompanying drawings. FIGS. 1 through 15 represent non-limiting, example embodiments as described herein.

FIG. 1 is a plan view illustrating a tape film package according to some embodiments of the inventive concept.

FIG. 2 is a cross-section of a tape film package taken along the line of FIG. 1 crossing first interconnection patterns in accordance with some embodiments of the present inventive concept.

FIG. 3 is a cross-section of the tape film package taken along line of FIG. 1 illustrating a PCB and an LCD panel provided at both sides of an insulating pattern of a user region in accordance with some embodiments of the inventive concept.

FIG. 4 is a cross-section illustrating a tape film package according to some embodiments of the inventive concept.

FIG. 5 is a block diagram illustrating a display device in accordance with some embodiments of the present inventive concept.

FIGS. 6 through 15 are cross-sections illustrating processing steps in the fabrication of tape film packages in accordance with some embodiments of the inventive concept.

Figure 1:
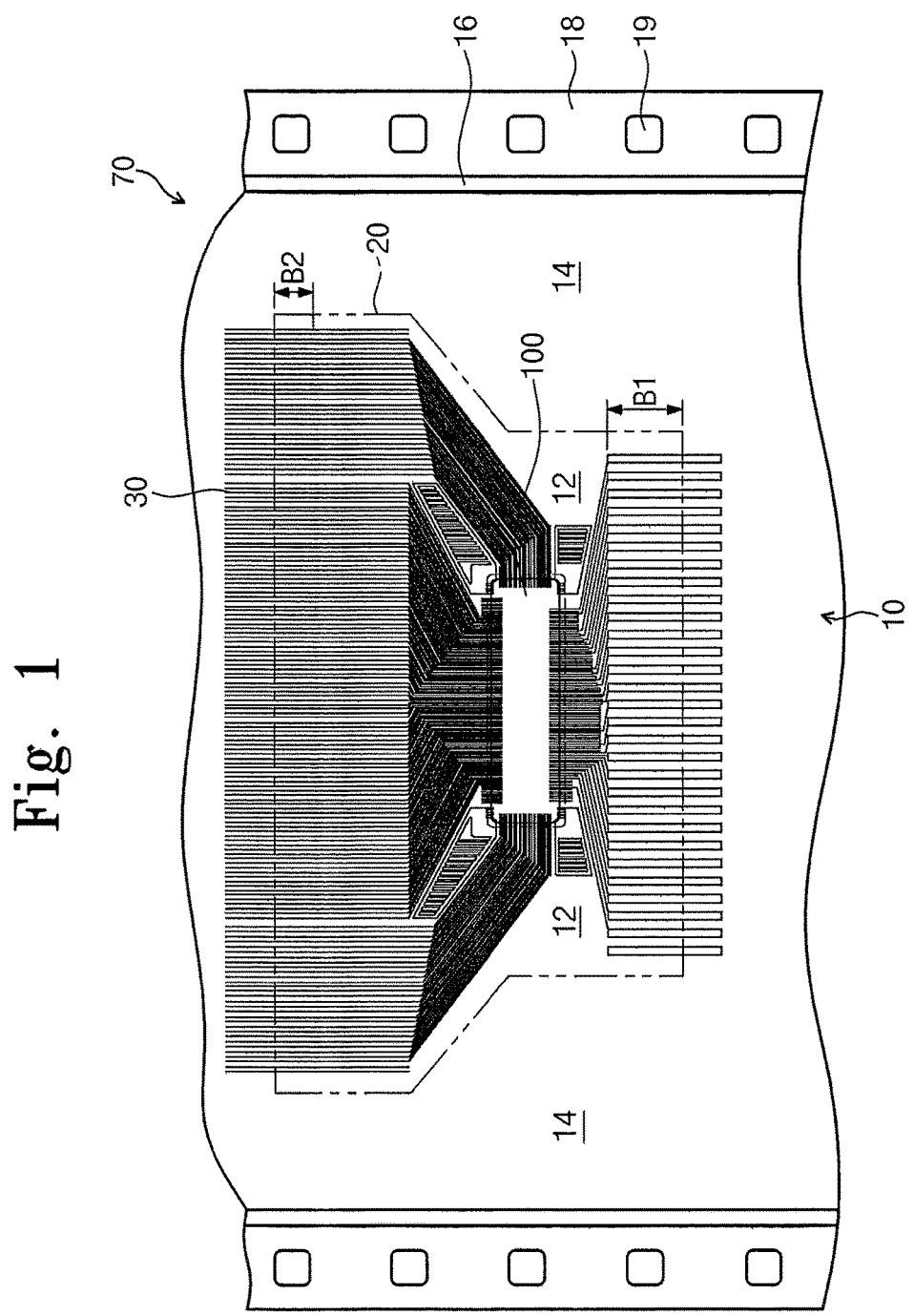

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
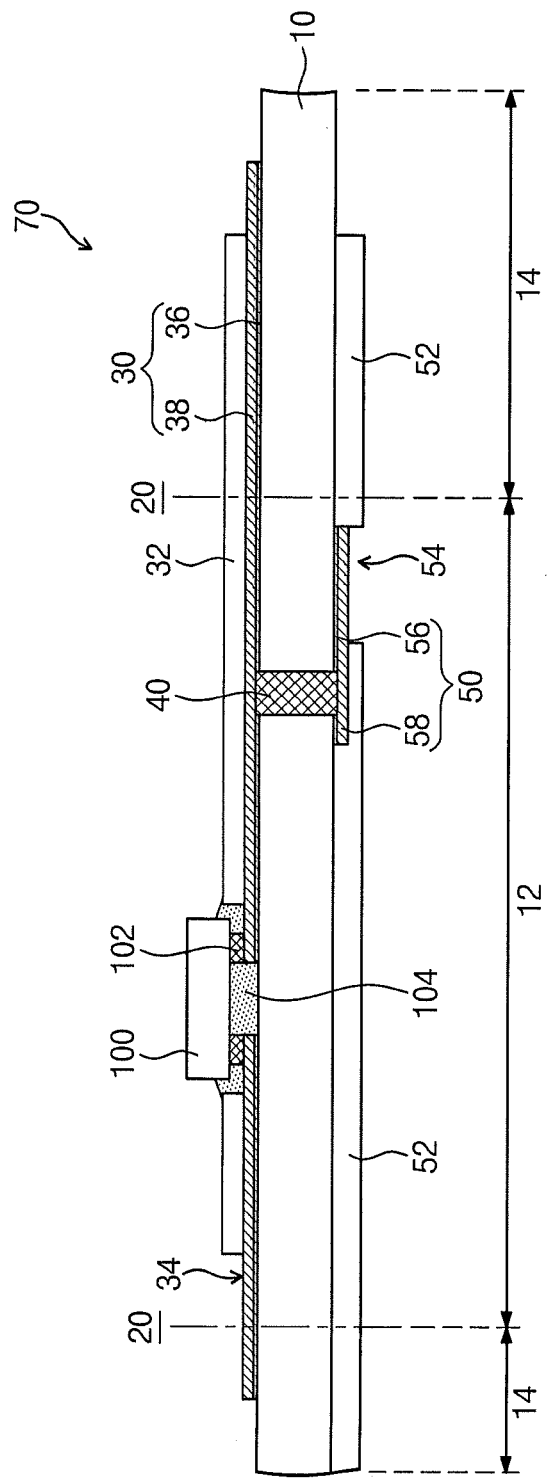
Figure 3:
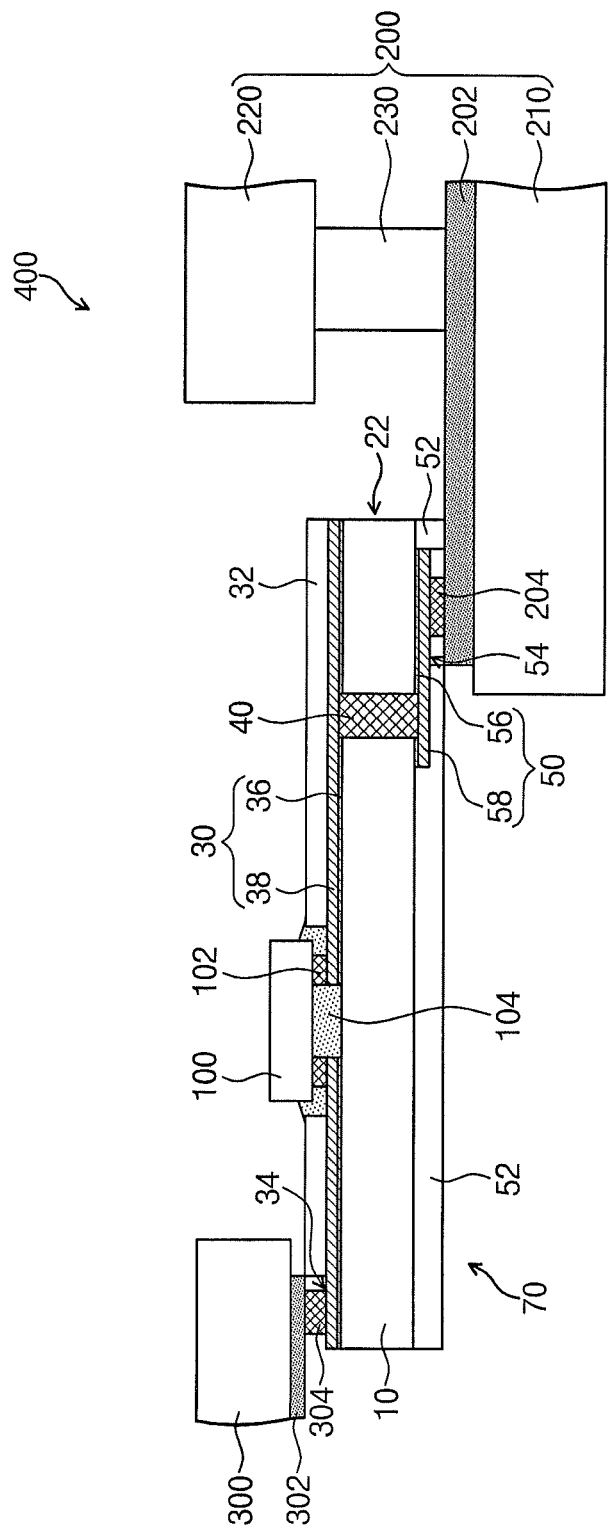

Referring now to FIG. 1 is a plan view illustrating a tape film package 70 according to some embodiments of the present inventive concept will be discussed. FIG. 2 is a cross-section of the tape film package 70 taken along the line crossing first interconnection patterns 30. FIG. 3 is a cross-section of the tape film package 70 taken along the line of FIG. 1 and shows a printed circuit board (PCB) 300 and a liquid crystal display (LCD) panel 200 provided at both sides of an insulating pattern 10 of a user region 12.

Referring now to FIGS. 1 through 3, the tape film package 70 includes the insulating pattern 10, the first interconnection patterns 30 disposed on the insulating pattern 10 and exposed by a cutting surface 22, and second interconnection patterns 50 disposed below the insulating pattern 10 to be parallel to the first interconnection patterns 30 and be spaced apart from the cutting surface 22.

The insulating pattern 10 may be formed of a flexible film (e.g., including polyimide or epoxy resin). The insulating pattern 10 may include the user region 12, a test region 14, a cutting slit 16, and a reeling region 18. The user region 12 may be an active region, in which first and second interconnection patterns 30 and 50 connected to a semiconductor chip 100 may be mounted. The test region 14 may be a peripheral region surrounding the user region 12. The user region 12 and the test region 14 may be separated from each other by a cutting line 20. In other words, the cutting line 20 may be formed to define the user region 12 and the test region 14. The user region 12 may have the cutting surface 22 cleaved from the test region 14 by a cutting tool, such as knife or punch. In some embodiments, the cutting surface 22 may be a sidewall of the insulating pattern 10 in the user region 12.

The first interconnection patterns 30 may extend from the user region 12 to the test region 14. The first interconnection patterns 30 in the test region 14 may include first pads 34 corresponding to contact portions, respectively, of a prober. Each of the cutting slit 16 and the reeling region 18 may be symmetrically disposed at both sides of the test region 14. The reeling region 18 may include holes 19 uniformly spaced apart from each other. The holes 19 may be used to control an operation of reeling or releasing the insulating pattern 10 in a winding reel (not shown). The cutting slit 16 may be configured to absorb an elastic force, which may occur between the reeling region 18 and the test region 14 during the operations in the winding reel.

The first interconnection patterns 30 may include a first seed pattern 36 and a first upper interconnection pattern 38. The first interconnection patterns 30 may extend from the semiconductor chip 100 provided in the user region 12 to the test region 14. A first solder resist 32 may cover the first interconnection patterns 30. The first solder resist 32 may prevent the first interconnection patterns 30 from being naturally oxidized by oxygen in the ambient air. The first interconnection patterns 30 may include the first pads 34 exposed by the first solder resist 32. The first pads 34 may be disposed at an edge of the user region 12 and in the test region 14. The first pads 34 in the test region 14 may be contacted by the prober. The first pad 34 in the user region 12 may be electrically connected to the semiconductor chip 100 or a bump 102. An encapsulating element 104 may be provided to adhere to the semiconductor chip 100 with the insulating pattern 10. In addition, the first pads 34 on the user region 12 may be electrically connected to a substrate pad 302 or a first solder 304 of the PCB 300.

The second interconnection patterns 50 may be disposed below the insulating pattern 10 in the user region 12 and be parallel to the first interconnection patterns 30. The second interconnection patterns 50 may be disposed below the insulating pattern 10 in the user region 12 and be spaced apart from the test region 14. The second interconnection patterns 50 may include a second seed pattern 56 and a second upper interconnection pattern 58.

A via contact 40 may be disposed in a via hole 41, the via contact 40 connecting the first interconnection patterns 30 electrically with the second interconnection patterns 50. The via contact 40 may be formed to penetrate the insulating pattern 10 between the first interconnection patterns 30 and the second interconnection patterns 50. In some embodiments, the second interconnection patterns 50 may be shorter than the first interconnection patterns 30.

In some embodiments of the inventive concept, considering a pattern arrangement near the cutting line 20 or the cutting surface 22, the first interconnection patterns 30 may be provided on the insulating pattern 10, while the second interconnection patterns 50 may not be provided below the insulating pattern 10. As a result, after a cutting operation to be performed along the cutting line 20, the first interconnection patterns 30 may be exposed by the cutting surface 22. By contrast, the second interconnection patterns 50 may not be exposed by the cutting surface 22 and be shielded or covered by a second solder resist 52.

The second solder resist 52 may be formed of an electrically insulating material. The second solder resist 52 may reduce the likelihood that the second interconnection patterns 50 will be naturally oxidized by oxygen in the ambient air. The second interconnection patterns 50 may include a second pad 54 exposed by the second solder resist 52. The second pad 54 may be spaced apart from the cutting line 20 or the cutting surface 22. The first pad 34 and the second pad 54 may be provided on and beneath the insulating pattern 10, respectively. The first pad 34 and the second pad 54 may be symmetrically provided at both sides of the semiconductor chip 100. In some embodiments, the first pad 34 may be provided at a position depicted by a reference numeral "B1" of FIG. 1 and be electrically connected to the substrate pad 302 and the first solder 304 of the PCB 300. In some embodiments, the second pad 54 may be provided at the position depicted by the reference numeral "B1" of FIG. 1 and be electrically connected to a panel pad 202 or a second solder 204 of the LCD panel 200. The panel pad 202 may include a data line and/or a gate line defining pixels on a thin-film-transistor (TFT) substrate 210. The TFT substrate 210 may be fixed to a color-filter substrate 230 by a sealant 230.

The second solder resist 52 may be disposed below the insulating pattern 10 near the cutting line 20. The second interconnection patterns 50 may be formed such that they do not contact a blade or knife during a cutting operation to be performed along the cutting line 20. The cutting line 20 or the cutting surface 22 may expose the second solder resist 52. The first interconnection patterns 30 may be exposed by the cutting surface 22. In some embodiments, the second interconnection patterns 50 may be configured to reduce the likelihood that metal particles will occur at the cutting surface 22. The second interconnection patterns 50 may be spaced from about 15 µm to about 30 µm from each other. The second interconnection patterns 50 may be shielded or covered by the second solder resist 52 and be spaced apart from the cutting surface 22. Thus, an electric short may be suppressed, or possibly prevented, from being formed by metal particles during jointing the second pad 54 with the panel pad 202.

Accordingly, according to some embodiments of the present inventive concept, it may be possible to increase a production yield of the tape film package 70 as discussed above.

Figure 4:
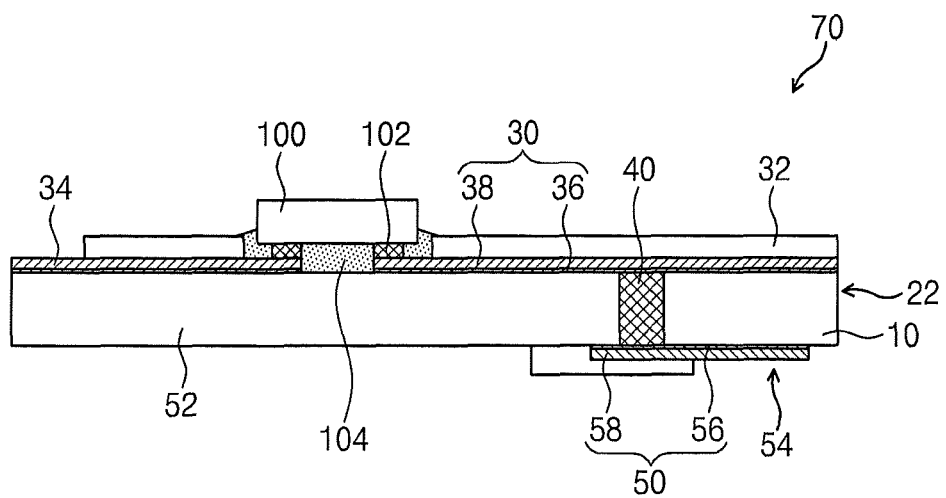

Referring now to FIG. 4, a cross-section illustrating a tape film package according to some embodiments of the inventive concept will be discussed. Referring to FIGS. 1 and 4, the insulating pattern 10 may be exposed between the second interconnection patterns 50 and the cutting surface 22. The second interconnection patterns 50 may be provided in the user region 12 and be spaced apart from the cutting surface 22. The cutting surface 22 may correspond to the cutting line 20 of FIG. 1. Since the second interconnection patterns 50 do not contact the cutting tool during a cutting operation, metal particles may not be produced. Accordingly, during jointing the second pad 54 of the second interconnection patterns 50 with the panel pad 202, it may be possible to suppress, or possibly, prevent an electric short from being formed by metal particles. As a result, it may be possible to increase a production yield of the tape film package 70 according to some embodiments of the inventive concept.

Figure 5:
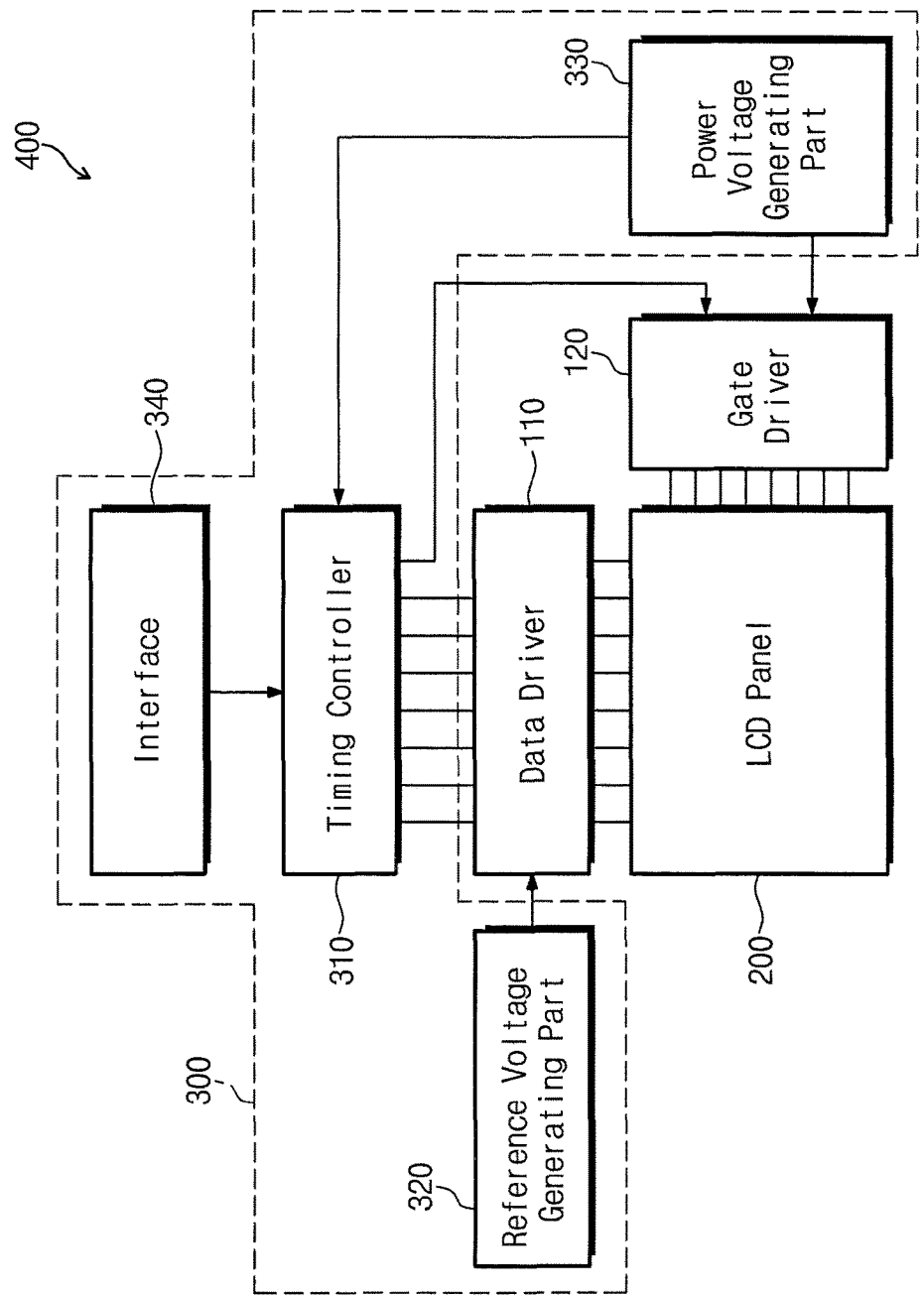

Referring now to FIG. 5, a block diagram illustrating a display device 400 according to some embodiments of the inventive concept will be discussed. As illustrated in FIGS. 1 and 5, the semiconductor chip 100 may correspond to a data driver 110 and/or a gate driver 120 of the display device 400. The data driver 110 may be configured to process a data signal output from a timing controller 310. The gate driver 120 may be configured to process a scan signal output from the timing controller 310. The semiconductor chip 100 for the data driver 110 and the gate driver 120 may be mounted on the tape film package 70. In some embodiments, the semiconductor chip 100 may be mounted on the tape film package 70, without a polymeric protection packaging element, in a wafer-level process.

The timing controller 310, a reference voltage generating part 320, a power voltage generating part 330, and an interface 340 may be mounted on the PCB(s) 300. The timing controller 310 may be configured to generate the data signal, the scan signal, and a control signal. The reference voltage generating part 320 may be configured to generate a reference voltage, which may be used to generate a color or image signal corresponding to the data signal from the data driver 110. The data signal may be provisionally stored or latched in the data driver 110 in response to the control signal. Thereafter, the color or image signal may be output to the data line of the LCD panel 200, in synchronization with the scan signal output from the gate driver 120. The gate driver 120 may be configured to output the scan signal to the gate line of the LCD panel 200 in a sequential manner. The power voltage generating part 330 may be configured to generate a power voltage for the timing controller 310 and the gate driver 120. In some embodiments, the power voltage and the reference voltage may be different from each other.

The tape film package 70 may be configured to provide electrical pathways between the PCB(s) 300 and the LCD panel 200. The first interconnection patterns 30 of the tape film package 70 may be electrically connected to the substrate pad 302 and the first solder 304 of the PCB(s) 300. The second interconnection patterns 50 of the tape film package 70 may be electrically connected to the panel pad 202 or second solder 204 of the LCD panel 200.

In some embodiments, the tape film package 70 may include a chip-on-film or a tape carrier package.

Referring now to FIGS. 6 through 15, cross-sections illustrating processing steps in the fabrication of tape film packages in accordance with some embodiments of the present inventive concept will be discussed. FIGS. 6 through 15 may correspond to the sectional view of FIG. 2. Referring first to FIG. 6, the insulating pattern 10 may be provided to include first and second seed layers 31 and 51. The insulating pattern 10 may include the user region 12 and the test region 14 defined by the cutting line 20. The insulating pattern 10 may include polyimide or epoxy-based polymers. The first and second seed layers 31 and 51 may include copper, gold, and/or tin. The first and second seed layers 31 and 51 may be formed on the insulating pattern 10 using a sputtering or evaporation method. The first and second seed layers 31 and 51 may be formed on the user region and the test region 14 of the insulating pattern 10. For example, the first and second seed layers 31 and 51 may be formed to cover top and bottom surfaces of the insulating pattern 10 with a thickness of about 1.0 μm.

Referring now to FIG. 7, a via hole 13 may be formed to penetrate the insulating pattern 10 in the user region 12. The via hole 13 may be formed at the user region 12 of the insulating pattern 10. The via hole 13 may be formed using, for example, a laser beam or a soldering iron. The via hole 13 may be formed to have a diameter ranging from about 15 μm to about 25 μm.

Figure 8:
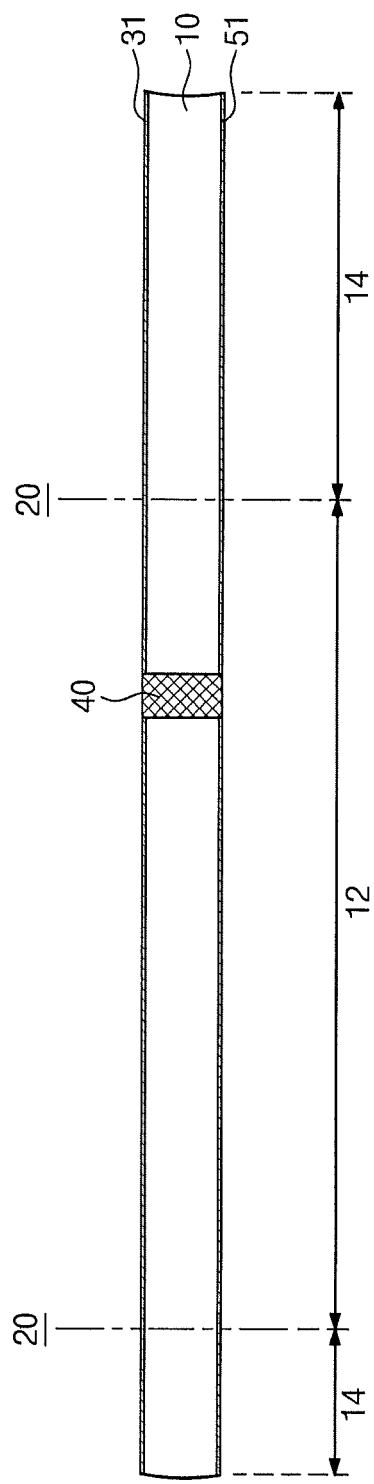

Referring now to FIG. 8, the via contact 40 may be formed in the via hole 13. In some embodiments, the via contact 40 may include copper or aluminum and may be formed using, for example, an electroplating or sputtering method.

Figure 9:
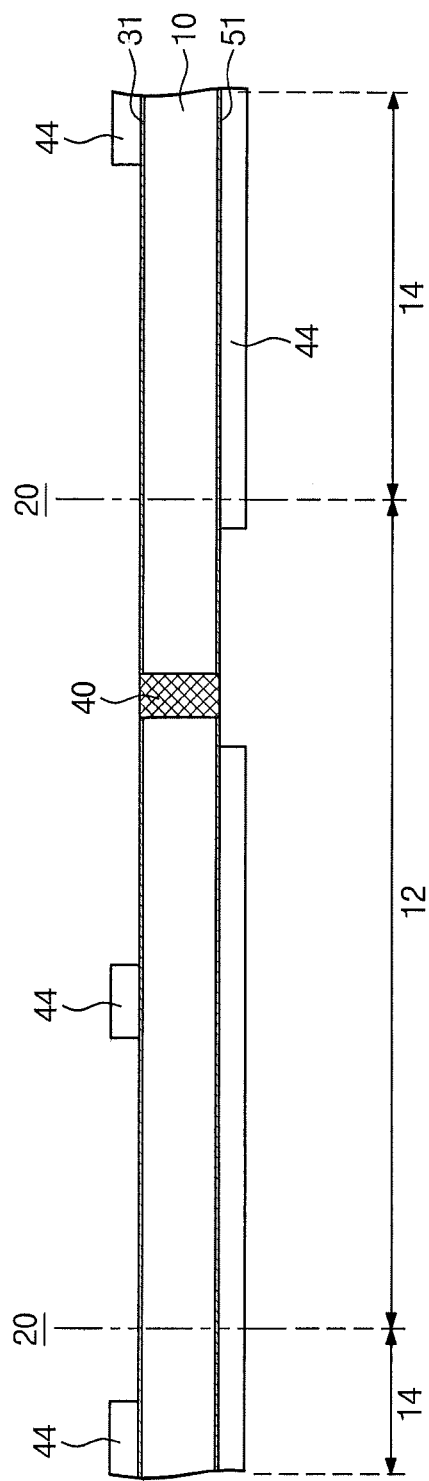

Referring now to FIG. 9, mask patterns 44 may be formed on and beneath the insulating pattern 10. The mask patterns 44 may be photoresist patterns formed by a photolithography process. The mask patterns 44 may be formed to expose a portion of each of the first and second seed layers 31 and 51. The first seed layer 31 may include portions exposed in the user region 12 and the test region 14, respectively. The first seed layer 31 may be exposed by the mask patterns 44, at the cutting line 20 serving as an interface between the user region 12 and the test region 14. The first seed layer 31 adjacent to the via contact 40 and the via contact 40 may be exposed by the mask patterns 44.

The second seed layer 51 may be exposed below the insulating pattern 10 in the user region 12, and the exposed portion of the second seed layer 51 may be spaced apart, by a specific space, from the cutting line 20. In other words, the mask patterns 44 may be formed to cover the second seed layer 51 disposed on the cutting line 20. The second seed layer 51 adjacent to the via contact 40 and the via contact 40 may be exposed.

Figure 10:
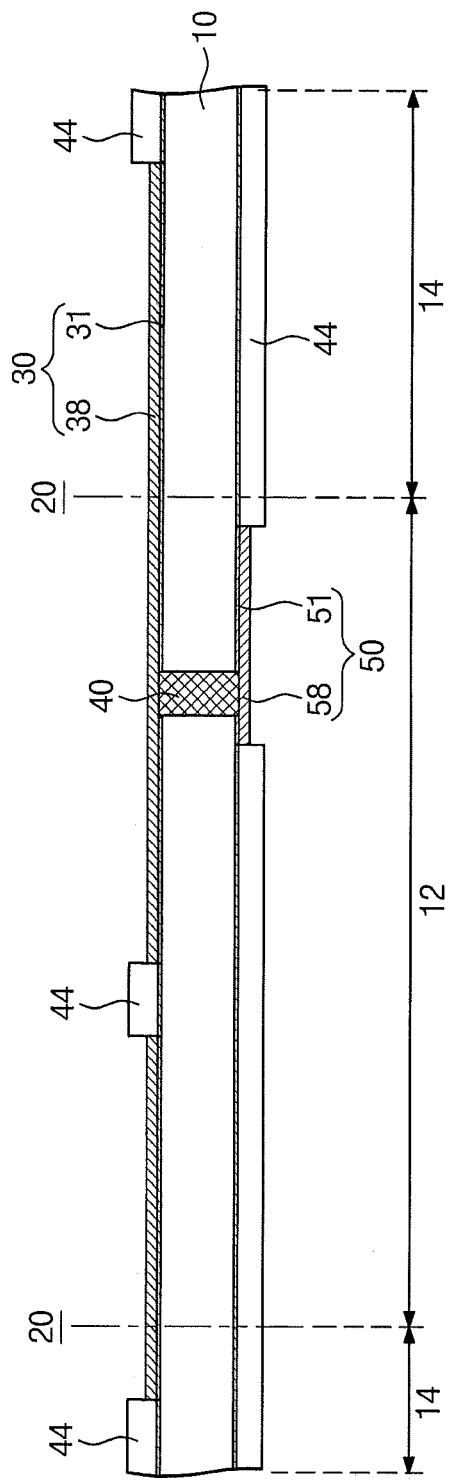

Referring now to FIG. 10, the first and second upper interconnection patterns 38 and 58 may be formed on the first and second seed layers 31 and 51 exposed by the mask patterns 44. The first upper interconnection pattern 38 and the second upper interconnection pattern 58 may be formed using, for example, an electroplating method. In some embodiments, the electroplating method may include an anodizing step separating conductive metals from an acidic or basic solution.

Figure 11:
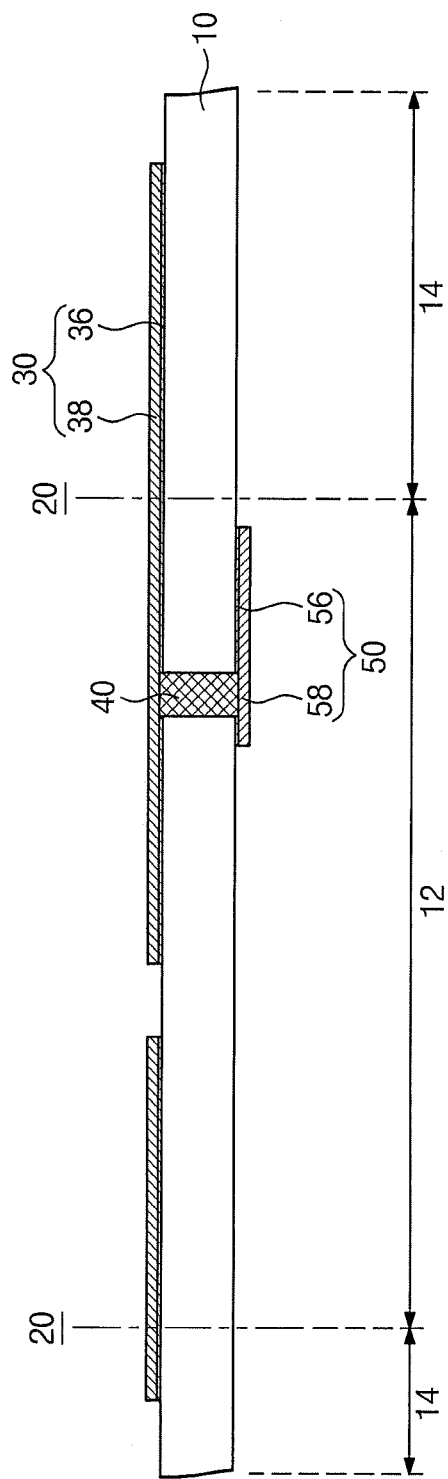

Referring now to FIG. 11, the mask patterns 44 and the first and second seed layers 31 and 51 may be removed to form the first interconnection patterns 30 and the second interconnection patterns 50 on and below the insulating pattern 10. The mask patterns 44 may be removed using a wet or dry method. For example, the mask patterns 44 may be removed, in a wet manner, using a volatile solvent, such as alcohol or acetone. The mask patterns 44 may be removed, in a dry manner, by an ashing or etching process using an oxygen plasma gas. The first and second seed layers 31 and 51 may be removed by a dry or wet etching process using the first and second upper interconnection patterns 38 and 58 as an etch mask. In some embodiments, the first and second upper interconnection patterns 38 and 58 may be partially or wholly removed during the removal of the first and second seed layers 31 and 51. The first interconnection patterns 30 may include the first seed pattern 36 and the first upper interconnection pattern 38. The first interconnection patterns 30 may be formed to have a thickness ranging from about 8 μm to about 12 μm. The second interconnection patterns 50 may include the second seed pattern 56 and the second upper interconnection pattern 58. In some embodiments, the second interconnection patterns 50 may be formed to have the same thickness as the first interconnection patterns 30.

It will be understood that example embodiments of the inventive concept are not limited to the configuration discussed above in which the first interconnection patterns 30 and the second interconnection patterns 50 are formed using the electroplating method. For example, the first interconnection patterns 30 and the second interconnection patterns 50 may be formed using a sputtering, a photolithography, or a laminating method without departing from the scope of the inventive concept.

Figure 12:
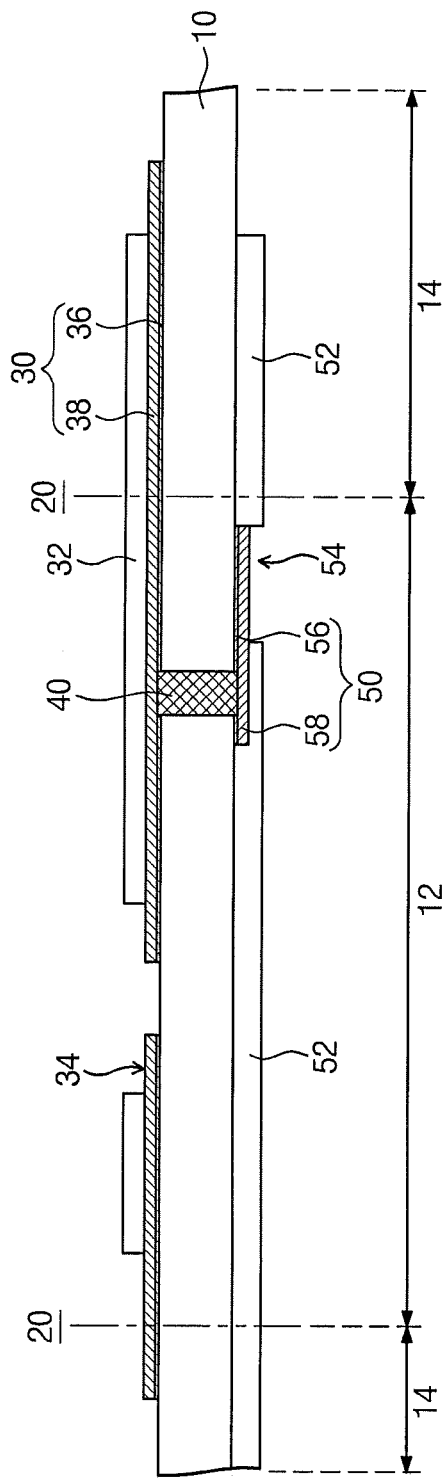

Referring now to FIG. 12, the first solder resist 32 and the second solder resist 52 may be formed on the first interconnection patterns 30 and the second interconnection patterns 50, respectively. The first solder resist 32 may cover the first interconnection patterns 30. The first solder resist 32 may be formed to expose the first pads 34 in the user region 12 and the test region 14. The second solder resist 52 may cover a portion of the second interconnection patterns 50 below the insulating pattern 10 in the user region 12. The second solder resist 52 may cover the insulating pattern 10 along the cutting line 20. The second pad 54 may be exposed by the second solder resist 52 in the user region 12. The second solder resist 52 may cover a bottom surface of the insulating pattern 10 positioned between the second interconnection patterns 50 and the test region 14. In some embodiments, the insulating pattern 10 between the second interconnection patterns 50 and the test region 14 may be exposed downward.

Figure 13:
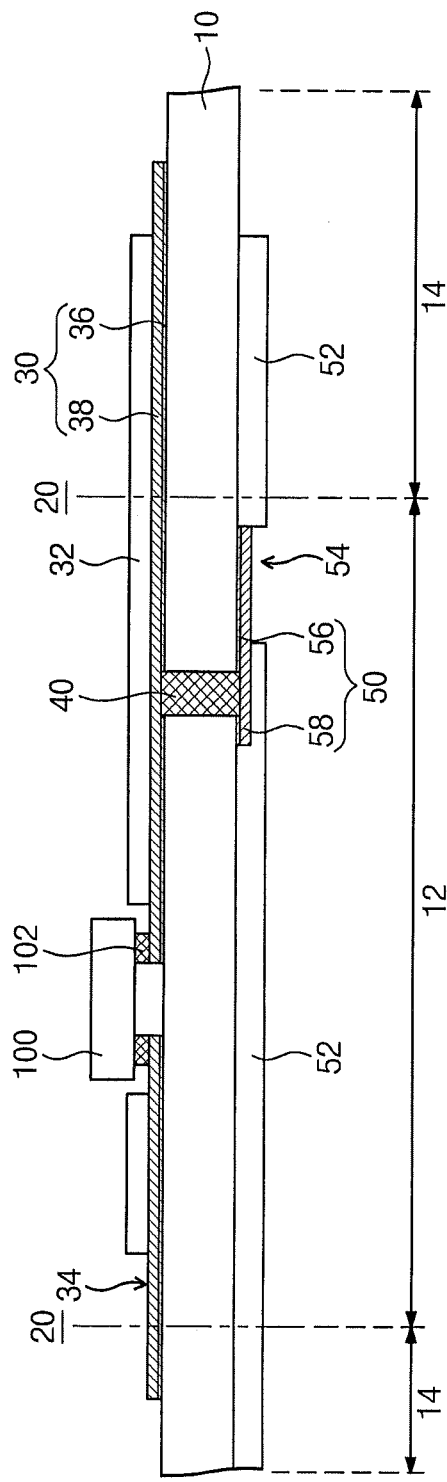

Referring now to FIG. 13, the semiconductor chip 100 or the bump 102 may be jointed onto the first pads 34 in the user region 12. The semiconductor chip 100 may be jointed to the first pads 34 of the first interconnection patterns 30 arranged adjacent to each other.

Figure 14:
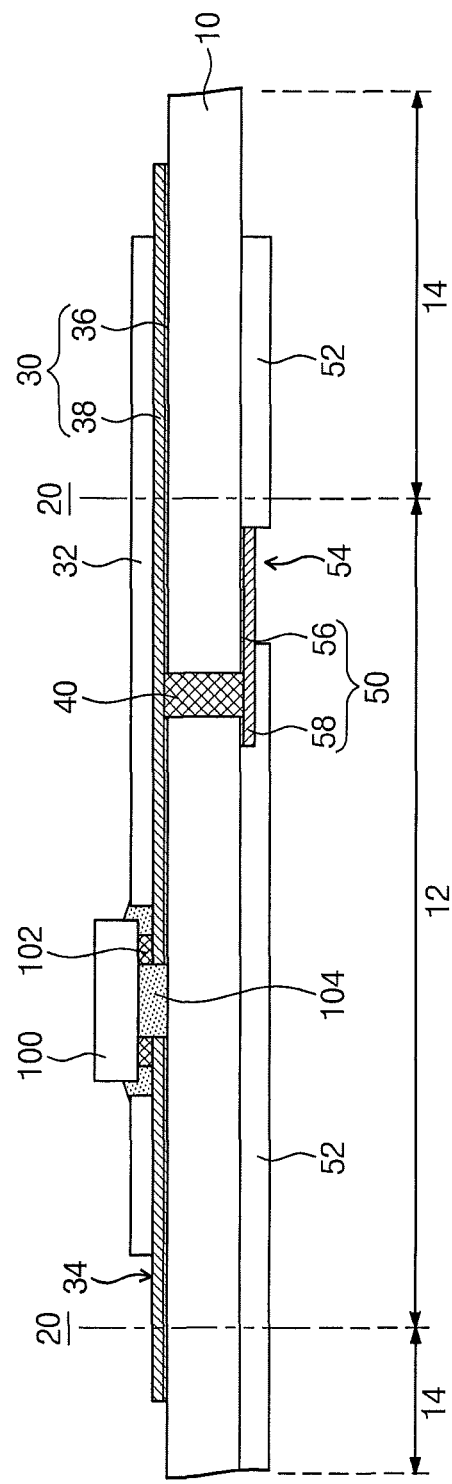

Referring now to FIGS. 2 and 14, the encapsulating element 104 may be formed between the semiconductor chip 100 and the first pads 34. Due to the presence of the encapsulating element 104, the semiconductor chip 100 may be fixed to the insulating pattern 10. The encapsulating element 104 may separate the semiconductor chip 100 electrically from the first pads 34. Next, an electric test may be performed to examine a resultant structure provided with the semiconductor chip 100. In the electric test, a prober and/or a universal type probe card may be in contact with the first pads 34 of the test region 14.

Figure 15:
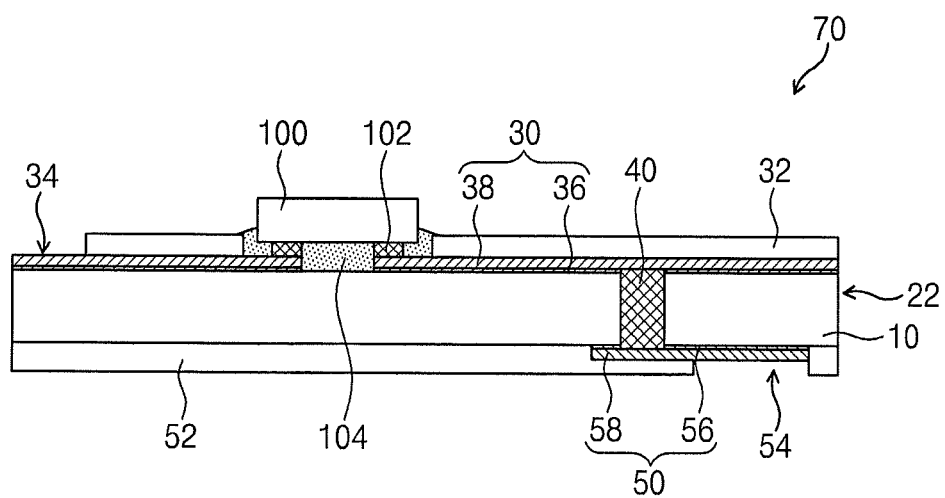

Referring now to FIGS. 3 and 15, the insulating pattern 10 and the first interconnection patterns 30 may be cut along the cutting line 20, such that the user region 12 may be separated from the test region 14. The insulating pattern 10 of the test region 14 and the user region 12 may be separated by a cutting tool. In some embodiments of the inventive concept, since the second interconnection patterns 50 do not contact the cutting tool during the operation of cutting the insulating pattern 10, it is possible suppress, or possibly prevent, metal particles from occurring. In other words, the second interconnection patterns 50 may suppress, or possibly prevent, an electric short from being formed by the metal particles during jointing the LCD panel 200 to the tape film package 70.

Accordingly, as discussed above, it may be possible to increase a production yield of the tape film package 70 according to some embodiments of the inventive concept.

According to example embodiments of the inventive concept, provided is the second interconnection pattern being shorter than the first interconnection pattern in the user region spanning from the via contact to the cutting surface. The first interconnection pattern and the second interconnection pattern may be disposed on and below the insulating pattern and be connected to each other through the via contact. Since the second interconnection pattern is spaced apart from the cutting surface or the cutting line and does not contact with a cutting tool, it may be possible to suppress, or possibly prevent, metal particles from occurring.

This enables an increase in a production yield of the tape film package according to example embodiments of the inventive concept.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a tape film package comprising:
   providing an insulating pattern having a user region and a test region defined by a cutting line;
   forming a via hole in the insulating pattern of the user region;
   forming a via contact in the via hole in the insulating pattern;
   forming first and second interconnection patterns connected to the via contact on an upper surface and a lower surface of the insulating pattern respectively, wherein the first interconnection pattern extends from the user region to the test region, the second interconnection pattern is shorter than the first interconnection pattern in the user region and spaced apart from the cutting line of the insulating pattern; and
   forming a solder resist on the second interconnection pattern,
   wherein the second interconnection pattern includes an interconnection region between the insulating pattern and the solder resist, and a pad region exposed by the solder resist from the interconnection region to an end of the second interconnection pattern adjacent the cutting line.

2. The method of claim 1, wherein forming the first and second interconnection patterns comprises forming the first and second interconnection patterns using an electroplating method.

3. The method of claim 1, wherein providing the insulating pattern comprises forming first and second seed layers on the upper surface and the lower surface of the insulating pattern, respectively.

4. The method of claim 3, wherein forming the via contact is followed by:
   forming mask patterns on the first seed layer and the second seed layer;
   forming first and second upper interconnection patterns on the first and second seed layer exposed by the mask patterns; and
   removing the mask patterns and the first and second seed layers below the mask patterns, wherein the mask patterns are formed to cover the second seed layer at the cutting line.

5. The method of claim 1, wherein the first and second interconnection patterns are formed using at least one of a laminating method, a sputtering method and a photolithography method.

6. The method of claim 1, further comprising:
   mounting a semiconductor chip on the insulating pattern of the user region; and
   cutting the insulating pattern according to the cutting line to form a cutting surface of the insulating pattern,
   wherein the second interconnection pattern is connected to the via contact below the insulating pattern and spaced apart from the cutting surface of the insulating pattern.

7. A method of fabricating a tape film package comprising:
   providing an insulating pattern having a user region and a test region defined by a cutting line;
   forming a via contact in the insulating pattern of the user region, the via contact exposed on an upper surface and a lower surface of the insulating pattern;
   forming first and second interconnection patterns connected to the via contact on the upper surface and the lower surface of the insulating pattern respectively, wherein the first interconnection pattern extending from the user region to the test region, and the second interconnection pattern is shorter than the first interconnection pattern in the user region and spaced apart from the cutting line of the insulating pattern; and forming a solder resist on the second interconnection pattern, wherein the second interconnection pattern includes an interconnection region between the insulating pattern and the solder resist, and a pad region exposed by the solder resist from the interconnection region to an end of the second interconnection pattern adjacent the cutting line; and wherein the solder resist is formed between a sidewall of the second interconnection patterns and the cutting surface.

8. The method of claim 7, wherein providing the insulating pattern comprises forming first and second seed layers on the upper surface and the lower surface of the insulating pattern, respectively.

9. The method of claim 8, further comprising:

forming mask patterns on the first seed layer and the second seed layer;

forming first and second upper interconnection patterns on the first and second seed layer exposed by the mask patterns; and removing the mask patterns and the first and second seed layers below the mask patterns, wherein the mask patterns are formed to cover the second seed layer at the cutting line.

10. The method of claim 7, further comprising:

mounting a semiconductor chip on the insulating pattern of the user region; and cutting the insulating pattern according to the cutting line to form a cutting surface of the insulating pattern, wherein the second interconnection pattern is connected to the via contact below the insulating pattern and spaced apart from the cutting surface of the insulating pattern.

* * * * *